(12) United States Patent
Barber et al.

(10) Patent No.: US 9,983,250 B2
(45) Date of Patent: May 29, 2018

(54) LINE BREAK DETECTION SYSTEM

(71) Applicant: NEXANS, Paris (FR)

(72) Inventors: Kenneth Willis Barber, Melbourne (AU); Michael Lee, Victoria (AU); Gilles Fouche, Donchery (FR)

(73) Assignee: NEXANS, Paris (FR)

( * ) Notice: Subject to any disclaimer, the term of this patent is extended or adjusted under 35 U.S.C. 154(b) by 508 days.

(21) Appl. No.: 14/242,271

(22) Filed: Apr. 1, 2014

(65) Prior Publication Data

US 2015/0115742 A1  Apr. 30, 2015

(51) Int. Cl.
| | |
|---|---|
| *H01H 47/00* | (2006.01) |
| *H01H 83/00* | (2006.01) |
| *H02J 7/00* | (2006.01) |
| *G01R 31/02* | (2006.01) |
| *H02H 1/00* | (2006.01) |

(52) U.S. Cl.
CPC ........... *G01R 31/026* (2013.01); *H02H 1/003* (2013.01); *Y10T 307/826* (2015.04)

(58) Field of Classification Search
CPC ........ G01R 31/026; H02H 1/003; G05B 9/02; Y10T 307/826
USPC ....... 324/500, 509, 512, 527, 528, 533, 534; 307/125
See application file for complete search history.

(56) References Cited

U.S. PATENT DOCUMENTS

| | | | |
|---|---|---|---|
| 2,594,371 A | 4/1952 | Ward | |
| 5,341,265 A * | 8/1994 | Westrom | H02H 1/0015 361/44 |
| 6,459,998 B1 * | 10/2002 | Hoffman | H02H 1/0076 340/661 |
| 7,945,400 B2 | 5/2011 | Hou | |
| 8,068,937 B2 * | 11/2011 | Eaves | H02H 3/30 307/125 |
| 2003/0133238 A1 | 7/2003 | Reedy | |
| 2008/0042874 A1 * | 2/2008 | Rogai | G01D 4/004 340/870.03 |
| 2010/0007354 A1 * | 1/2010 | Deaver, Sr. | G01R 31/025 324/539 |
| 2011/0140911 A1 * | 6/2011 | Pant | H04B 3/546 340/870.02 |

OTHER PUBLICATIONS

Cited documents relating to the Australian procedure dated May 20, 2016.
Broken Conductors Protection System Using Carrier Communication, etc. dated Aug. 2002.
Power Line Communications for Smart Grid Applications, etc. dated Dec. 2012.
Narrowband orthogonal frequency division multiplexing power line communication transceivers, etc. dated Oct. 2012.

* cited by examiner

*Primary Examiner* — Richard Tan
(74) *Attorney, Agent, or Firm* — Sofer & Haroun, LLP

(57) ABSTRACT

A line break detection system for detecting a break in a conductor (1.004), the system including a first return signal generator (1.020) proximate a first end of a segment of the conductor, the first return signal generator being adapted to apply a first return signal to the conductor, the system including a first return signal detector (1.016) proximate a second end of the segment of the line, the second end being upstream of the first end, the first detector being adapted to receive the first return signal from the line, wherein the first return signal generator ceases to generate the first return signal if the line is broken.

20 Claims, 11 Drawing Sheets

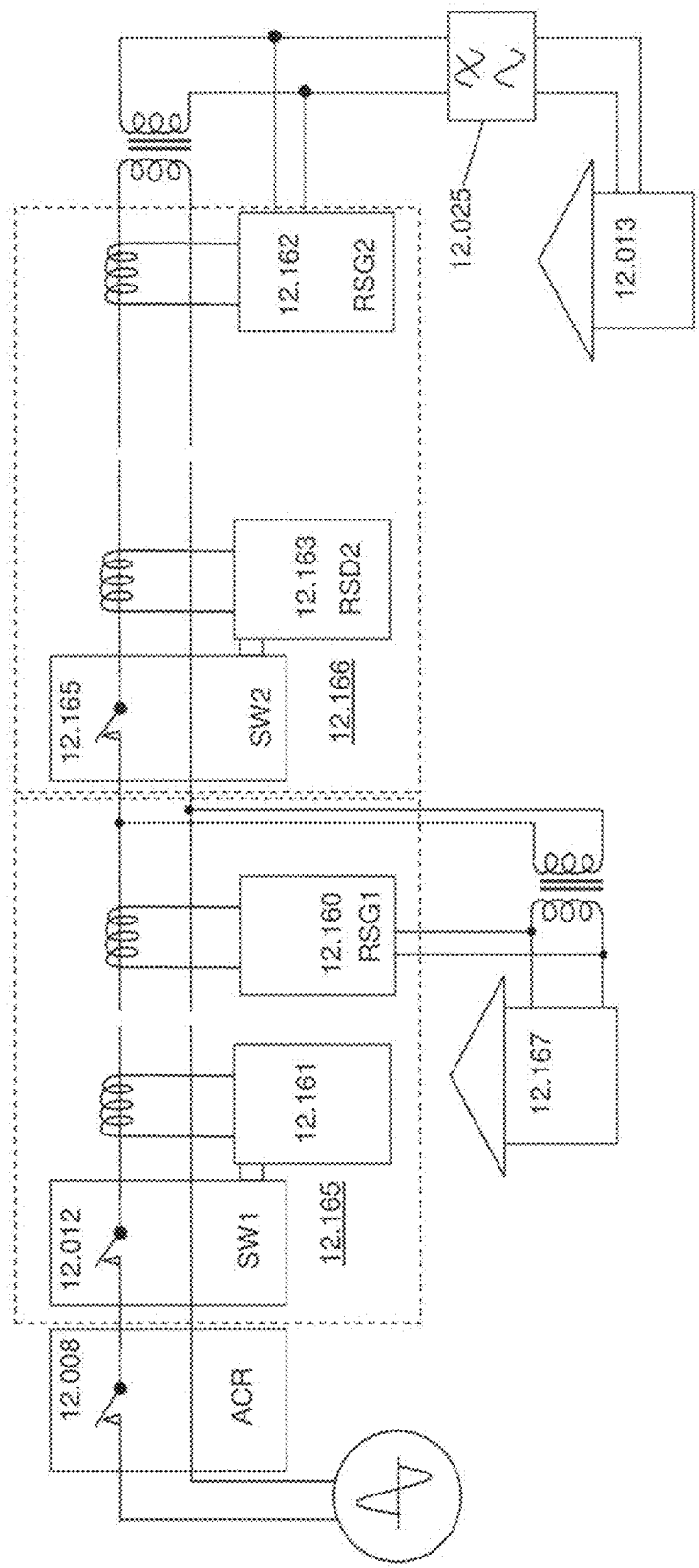

LINE BREAK DETECTION SYSTEM

RELATED APPLICATION

This application claims the benefit of priority from Australian Patent Application No. 2013 904213, filed on Oct. 31, 2013 and Australian Patent Application No. 2014 200964, filed on Feb. 25, 2014, the entirety of which is incorporated by reference.

BACKGROUND OF THE INVENTION

Field of the Invention

This invention relates to the detection of a break or short circuit in a line such as a power supply line on power distribution systems. The distribution system can be AC or DC.

The invention can be adapted to isolation of power supply lines which have broken.

The invention is readily adapted for use in various power distribution systems, such as three phase, two phase, single phase, single wire earth return, whether bare wire or covered conductor distribution systems.

Description of Related Art

In AC power distribution systems, the power supply line can carry a higher supply voltage than the voltage supplied to the consumers. A transformer is used to reduce the power line voltage to the level required for the consumer. This is done to reduce the current on the power supply line, or, in the case of single line earth return systems, to provide sufficient voltage to overcome the high resistance of the earth return path. For example, in an SWER (single wire earth return) system, the power line voltage can be above 1000 v, while the customer voltage may be of the order of 250 v.

A covered conductor system is a high voltage distribution system using one or more lightly insulated overhead line conductors. SWER applications systems can be difficult to adequately protect due to the high impedance or resistance of the circuit and earthing arrangements. If the line breaks and the upstream side of the line falls to the ground or if a tree touches the line, there may be a delay before the standard earth fault protection systems operate due to the electrical insulation of the cable delaying or preventing detection of the fault current. If sparking occurs, this can start bush or brush fires and may thus result in damage. If there are no sparks, the line may remain live and present a risk of electrocution if a person or animal were to come into contact with the wire.

In the case of a bare overhead conductor system, such as for a bare wire SWER cable or other bare wire conductor systems, the broken cable may make sufficient contact with the ground to trip the Automatic Circuit Reclosure switch (ACR) or other earth leakage protection breaker switch. These earth fault protection systems now in use may not be sufficiently sensitive to operate reliably to detect earth faults, particularly where the current drawn by the consumer is low. Further, if a bare wire cable were to break and the upstream end (supply side) of the broken cable were too short to reach the ground or were to make inadequate contact with the ground, the existing fault detection system may not detect the break, leaving the upstream end of the cable live. This would give rise to a risk of electrocution if a person or animal were to come in contact with the live end of the cable.

It should be noted that unlike underground cable circuits most overhead line circuits whether they are bare or covered, are protected with an Automatic Circuit Reclosure Circuit Breaker System (ACR). The principle is that because overhead lines are be subjected to numerous transient faults e.g. birds sitting on insulators or windblown debris. Shorting out the wires. When such a fault occurs, the ACR first switches off the circuit but then automatically switches the power on again, usually after about a 1 second interval. If a fault is still apparent on the second energisation then it will then switch off the circuit. If no fault is detected on the re-energisation, then the power remains on the circuit. Naturally if a line breaks and the conductor is not shorted to earth then the ACR might create a dangerous situation because power will be allowed to remain on the circuit. Thus the line break protection system of the present invention can be used in conjunction with an ACR to prevent the reclosure of the ACR from delivering power to the broken wire.

Putting the supply underground would solve the problem but this is expensive using conventional HV ABC (aerial bundled cable) is costly and requires more poles due to the weight of the cable.

Power line communication (PLC) systems are used by power utilities to communicate between elements of the power supply system and consumer meters.

In the following description, the terms "upstream" and "downstream" are used such that "upstream" refers to a location nearer the source of electricity supply, while the term "downstream" refers to a location further from the source of the source of supply of electric power. Similarly, "above" and "below" are used to refer to relative proximity or remoteness to the supply end of the distribution system, unless the context requires otherwise.

SUMMARY OF THE INVENTION

According to an embodiment of the invention, there is provided a method of detecting a line fault on a section of a power supply line, the method including the steps of injecting a return signal (8.133) at the downstream end of the section, and detecting the return signal at the upstream end of the section.

The method can include the step of removing power from the section of the power supply line in the event of failure to detect the return signal at the upstream end of the section.

According to an embodiment of the invention, there is provided a power supply line fault detection return signal generator (RSG) including means to generate a return signal (5.128), and means to apply the return signal to the power supply line (5.122, 5.124, 5.126).

According to an embodiment of the invention, there is provided a power supply line fault detection return signal detector (RSD) including means to receive a return signal (4.112, 4.114, 4.108) from the power supply line, means to analyse the return signal (4.110), and means to produce a power line control signal (4.110, 4.110.1) in response to the presence or absence of the return signal.

The RSD can include a power interruption breaker switch (4.008) to remove power from the line in response to the detection of an absence of a return signal.

According to an embodiment of the invention, there is provided a return signal repeater (7.074) including return signal detection means (7.123, 7.114, 7.108, 7.130) adapted to detect return signals from a RSG, and return signal regeneration means (7.130, 7.126, 7.124, 7.123).

According to an embodiment of the invention, there is provided a return signal concentrator, including return signal detection means adapted to detect and distinguish two or more return signals from two or more RSGs, and return signal regeneration means adapted to produce a concentrated return signal.

The concentrated return signal can be adapted to indicate the presence or absence of each of the two or more return signals from the two or more RSGs.

According to an embodiment of the invention, there is provided a power supply line break detection system including at least one RSG (6.020, 6.040, 6.053), each RSG being adapted to generate a characteristic return signal which is applied to the power supply line (6.005, 6.066, 6.034), wherein a RSD (6.009) connected to the line upstream of the or each RSG detects the return signal to confirm continuity of the supply line, and, in the absence of the return signal, generates a fault signal.

The power supply line break detection system can include a first breaker switch (6.012), the RSD being adapted operate the breaker switch to isolate the line from a source of electrical power (2.001) when the RSD detects the absence of a return signal.

The RSD can be adapted to associate each characteristic return signal with its corresponding RSG.

The power supply line break detection system can include a return signal concentrator (6.074), adapted to receive return signals (6.068, 6.069) from two or more downstream RSGs, and to generate a concentrated return signal (6.063) for transmission to the RSD (6.009).

The power supply line break detection system can include a branch line (2.034) including a corresponding branch RSG (2.040) located at a distance from the junction of the second branch line, the branch RSG generating a characteristic return signal associated with the branch RSG, the system including a branch RSD located on the branch line nearer the junction of the branch line, the branch RSD being adapted to detect the characteristic return signal from the branch RSG.

The power supply line break detection system can include a second breaker switch (2.037) adapted to disconnect the branch line from the source of electrical power (2.001) in response to a control output from the branch RSD.

Each branch line can be fitted with a corresponding return signal generator locates proximate a downstream end of a segment of the corresponding branch line, and a corresponding detector located proximate the junction of the corresponding branch line which is adjusted to suit the frequency of the corresponding return signal of the appropriate signal generator.

According to a further embodiment of the invention, there is provided a power supply line monitoring system monitoring a segment of a power supply line, the system including a RSG at a downstream end of the segment of power supply line, and a RSD at the upstream end of the segment of power supply line, wherein the RSG generates a return signal and transmits the return signal to the RSD, to indicate the presence or absence of a supply voltage at the downstream end of the segment of power supply line.

The RSG can transmit the return signal wirelessly.

The RSG can transmit the return signal to the RSD in the absence of supply voltage at the downstream end of the segment of power supply line.

According to another embodiment of the invention, there is provided a signal generator controlled by the line voltage detector to generate a return signal, and a wireless transmitter connected to the signal generator to transmit the return signal.

BRIEF DESCRIPTION OF THE DRAWINGS

An embodiment or embodiments of the present invention will now be described, by way of example only, with reference to the accompanying drawings, in which:

FIG. 12 shows a hypothetical series connections of an ACR and two RSDRSG Pairs;

Figure 1:
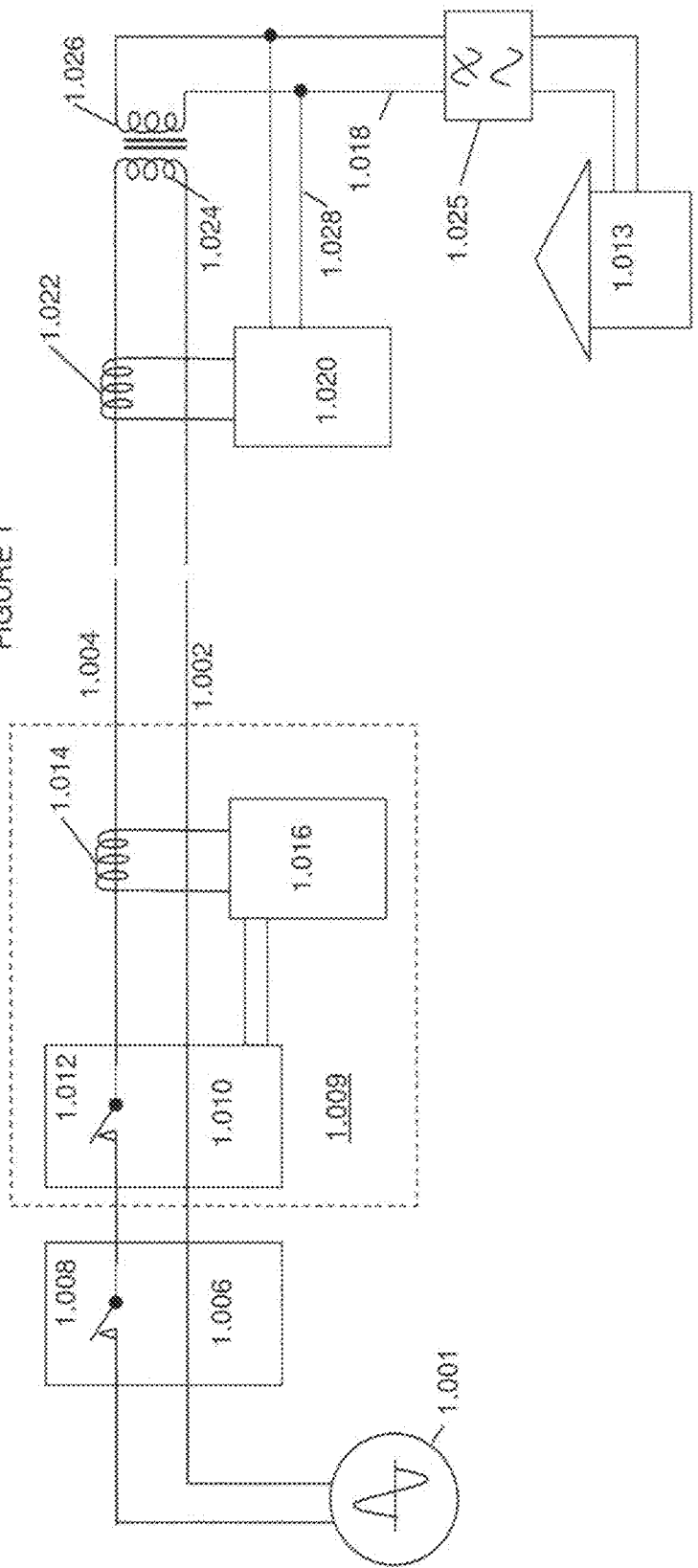
FIG. 1 illustrates a power supply line including a protection system according to a first embodiment of the invention.

In the drawings, long lengths of power lime are indicated by a gap in the line;

The numbering convention used in the drawings is that the digits in front of the full stop indicate the drawing number, and the digits after the full stop are the element reference numbers. Where possible, the same element reference number is used in different drawings to indicate corresponding elements; and It is understood that, unless indicated otherwise, the drawings are intended to be illustrative rather than exact representations, and are not necessarily drawn to scale. The orientation of the drawings is chosen to illustrate the features of the objects shown, and does not necessarily represent the orientation of the objects in use.

DETAILED DESCRIPTION OF THE EMBODIMENT OR EMBODIMENTS

In this specification, in the case where the supply voltage is transmitted at a higher voltage to a consumer step-down transformer, the term "supply voltage" is used to refer to the voltage on the upstream side of the consumer transformer, and the term "consumer voltage" is used to refer to the voltage delivered to the consumer. Similarly, supply line" refers to the line carrying the supply voltage, and consumer line" refers to the line carrying the consumer voltage.

With reference to FIG. 1, a power distribution system includes an active conductor 1.004 with a neutral line 1.002 which, in the case of a SWER supply, can be the earth return path. A voltage supply 1.001 delivers the voltage supply to power line 1.004. In the case of a SWER supply system, the supply voltage across the input of the lines 1.004 and 1.002 can be a high voltage, typically above 5 kv as the earth return is a high impedance path. For example the voltage may be of the order of 12.7 kV, and higher voltages are also used in SWER applications. The supply voltage may have a frequency equal to the domestic supply frequency, e.g., of the order of 50 Hz.

The active conductor is connected to a consumer 1.013 via a step-down transformer with a high voltage side 1.024 and a low voltage side 1.026, which reduces the voltage at the consumer premises to a nominal domestic supply voltage, usually less than 1000 v, e.g., 240 V.

The bare or covered conductor line 1.004 may be fitted with a known auto circuit reclosure (ACR) earth fault protection circuit 1.006 and also with a first high voltage breaker switch 1.008. This ACR-high voltage breaker switch is to provide primary protection to isolate the supply circuit in the event of faults such as insulation failure or when remotely operated by the electricity supply company for any reason. (e.g. safety or maintenance). A return signal generator 1.020 is powered from the low voltage side 1.026 of the step-down transformer, and injects a return signal onto the line 1.004 via first coil 1.022 which is in electromagnetic interaction with the line 1.004. As discussed below with reference to FIG. 5, in an alternative embodiment, capacitive coupling between the RSG and the power supply line can be used to inject the return signal onto the power supply line.

In one embodiment, the return signal can be a frequency in the low frequency range, for example between approximately 150 kHz and 500 kHz. However, the signal can be of a lower or higher frequency without departing from the spirit of the invention, provided the signal frequency can be differentiated from the power supply frequency. An additional restraint on the choice of frequency is the availability of a suitable RF spectrum allocation.

A return signal detector 1.016 is located on the upstream or supply side of the signal generator. The signal detector has a pick-up coil 1.014 in electromagnetic interaction with the line 1.004. Again, in an alternative embodiment, capacitive coupling can be used to pick up the return signal on the power supply line.

Coil 1.022 can be designed to deliver the return signal to the power line 1.004. Coil 1.014 can be designed to detect the signals at the return signal frequency on power supply line 1.004.

The return signal generator 1.020 requires a supply voltage on its supply input line 1.028. This can be provided by stepping down, rectifying and filtering the domestic supply voltage from transformer coil 1.026. Thus, if the line 1.004 is broken, the return signal will not reach the RSD due to the break in the power supply line.

In the case where the RSG is powered solely from the power distribution system, the high voltage supply to step down transformer coil 1.024 will be interrupted when the power supply line is broken, and there will be no domestic supply voltage on the coil 1.026. Thus, in an alternative embodiment, the RSG can be provided with an auxiliary power supply, such as batteries, which can be charged from the power supply or from a solar power generator.

The broken line protection circuit 1.009 includes a return signal detector 1.016 connected to the return signal pick-up 1.014, and a relay 1.010 with high voltage breaker switch 1.012. The detector 1.016 controls the relay 1.010 and a high voltage breaker switch 1.012 so that, when the return signal is present, the relay maintains the breaker switch 1.012 closed to permit the high voltage supply to be delivered to the step-down transformer coil 1.024 via line 1.004.

However, if the line 1.004 is broken, the high voltage supply to the coil 1.024 will be interrupted. As a result, the detector coil 1.014 will no longer receive the return signal, and the detector 1.016 will cause the relay 1.010 to open the contacts 1.012, isolating the downstream portion of line 1.004 from the high voltage supply.

A low pass filter 1.025 can be used to prevent the high frequency return signal from entering the domestic supply of the consumer 1.013.

In one embodiment, the return signal generator can include a transformer, a rectifier, and a signal generator, such as an oscillator or tone generator. In embodiments described below, the return signal can be a signal which carries additional information, such as, for example, a characteristic bit patter associated with a specific a RSG.

Figure 2:
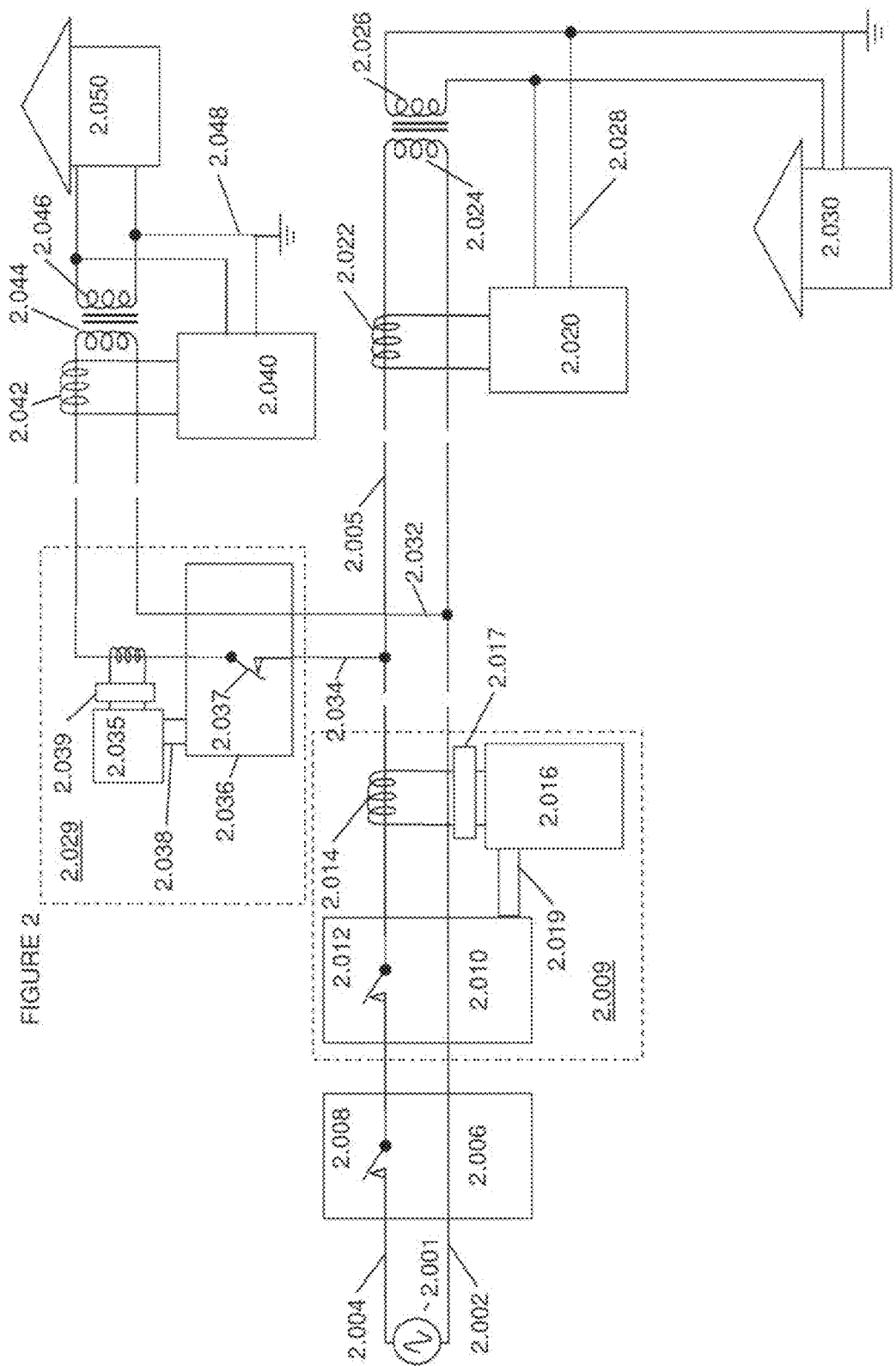
FIG. 2 illustrates a power supply line including a protection system according to a second embodiment of the invention.

As shown in FIG. 2, in some applications a number of branch lines can be connected to a power supply line 2.004. FIG. 2 illustrates a power supply system having two consumers 2.030 and 2.050, consumer 2.030 being supplied by first branch line 2.005, similar to the arrangement of FIG. 1, and consumer 2.050 being supplied by a second branch line 2.034 which has a junction with main line 2.004 and first branch line 2.005. For the sake of clarity, each line downstream of the junction will be referred to in the description of the embodiment of FIG. 2 as a branch line, although, in practice, one of the lines may be considered to be the main line. Also, for the sake of clarity, the line upstream of the first junction will be referred to as the main line. This embodiment of the invention contemplates more than two branch lines, but will be described in the context of two branch lines to avoid unnecessary complexity.

If the line 2.005 to consumer 2.030 is intact, but the line 2.034 to consumer 2.050 is broken, the embodiment of the invention shown in FIG. 2 permits power to consumer 2.030 to be maintained while power to line 2.034 is cut off.

The power supply system of FIG. 2 includes a first active conductor 2.004 upstream of the junction of the branch lines 2.005 and 2.034 with a neutral line 2.002. The neutral line for branch line 2.034 is line 2.032. A high voltage supply 2.001 delivers the high voltage supply to line 2.004 and the first branch line 2.005 and the second branch line 2.034 derive power from line 2.004. In the case of a SWER power supply system, the line 2.002 is replaced by an earth return path, and the supply voltage across the input of the line 2.004 to earth 2.002 can be a high voltage, typically above 5 kv as the earth return is a high impedance path.

The first branch line 2.005 is connected to a consumer 2.030 via a step-down transformer with a high voltage side 2.024 and a low voltage side 2.026, which reduces the voltage at the consumer premises to a nominal domestic supply voltage, for example, of the order of 240 V.

The main line 2.004 may be fitted with a known auto circuit reclosure (ACR) earth fault protection circuit 2.006 and with a first high voltage breaker switch 2.008.

A first return signal generator 2.020 is powered from the low voltage side 2.026 of the step-down transformer, and injects a first return signal having a first signal frequency onto the first branch line 2.005 via first coil 2.022 which is in electromagnetic interaction with the first branch line 2.005. In one embodiment, the first return signal can have a frequency of the order of 1 MHz. Preferably the return signal frequency is within the range of approximately 150 kHz to 500 kHz.

A first return signal detector 2.016 is located on the upstream or supply side of the first signal generator 2.020. The first signal detector can be located upstream of the junction of the first and second branch lines, proximate the beginning of main line 2.004. The first signal detector has a first pick-up or detector coil 2.014 in electromagnetic interaction with the line 2.004. A frequency selective filter 2.017 can be chosen to pass only the first return signal frequency to the first detector 2.016. The filter can be a digital filter.

The first broken line protection circuit 2.009 includes a first return signal detector 2.016 and a first relay 2.010 with first high voltage breaker switch 2.012. The first detector 2.016 controls the first relay 2.010 and the first high voltage breaker switch 2.012 so that the first return signal generator 2.020 generates the first return signal, which is detected by detector 2.016, and the relay 2.010 maintains the breaker switch 2.012 closed to permit the high voltage supply to be delivered to the step-down transformer coil 2.024 via branch line 2.005.

As discussed in relation to FIG. 1, in the event that main line 2.004 or first branch line 2.005 is broken, the first detector coil 2.014 will no longer receive the first return signal, and the first detector 2.016 will cause the first relay 2.010 to open the contacts 2.012, isolating the downstream portion of main line 2.004 from the high voltage supply, and hence isolating the broken first branch line 2.005 and the branch 2.034 from the power supply.

However, in the system shown in FIG. 2, a break in the second branch line 2.034 will not cause interruption to the power supply on line 2.005. The second branch line 2.034 is fitted with a second return signal generator 2.040 and a second broken line protection circuit 2.029. The second broken line protection circuit 2.029 is of the same construction as the first broken line protection circuit 2.009, and includes a second detector 2.035 and second relay 2.036 with second high voltage breaker switch 2.037. Thus, if line 2.034 is broken, the electricity supply to the second return signal generator 2.040 will be interrupted and the second breaker switch 2.037 will be opened to disconnect power to second branch line 2.034 downstream of breaker switch 2.037. At the same time, power supply to the first branch line 2.005 is uninterrupted.

In order to ensure that relay 2.036 does not maintain the breaker switch 2.037 closed when the second return signal does not reach the second RSD 2.035 due to a break in line 2.034, the detector 2.035 must be able to distinguish between the first return signal from first signal generator 2.020, and the second return signal from second return signal generator 2.040. To achieve this, second detector 2.029 accepts a frequency different from that of the first generator to selectively operate the respective high voltage breaker switch 2.037.

Each RSD can be fitted with a suitable signal discriminator. In one embodiment, the signal discriminator can be a filter. This can be achieved by ensuring that the frequency of the second return signal is different from frequency of the first return signal, the frequency difference being such that filter 2.039 can block the first return signal while passing the second return signal to the detector 2.035.

Similarly, filter 2.017 prevents detector 2.016 from erroneously maintaining contact 2.012 of relay 2.010 in the closed position when branch line 2.005 is broken downstream of its junction with lines 2.004 and 2.034 by blocking the second return signal from the detector 2.016 while allowing the first return signal to pass to the first detector 2.016.

When line 2.005 is broken, then because breaker switch 2.012 is upstream of the junction of line 2.034 with line 2.004, power will also be cut off from line 2.034 whether the break is upstream or downstream of the junction of line 2.034 with line 2.004.

Of course, other signalling systems beside simple frequency signals can be used for the return signals, and signal discriminators suitable for the alternative signals can be used.

Figure 3:
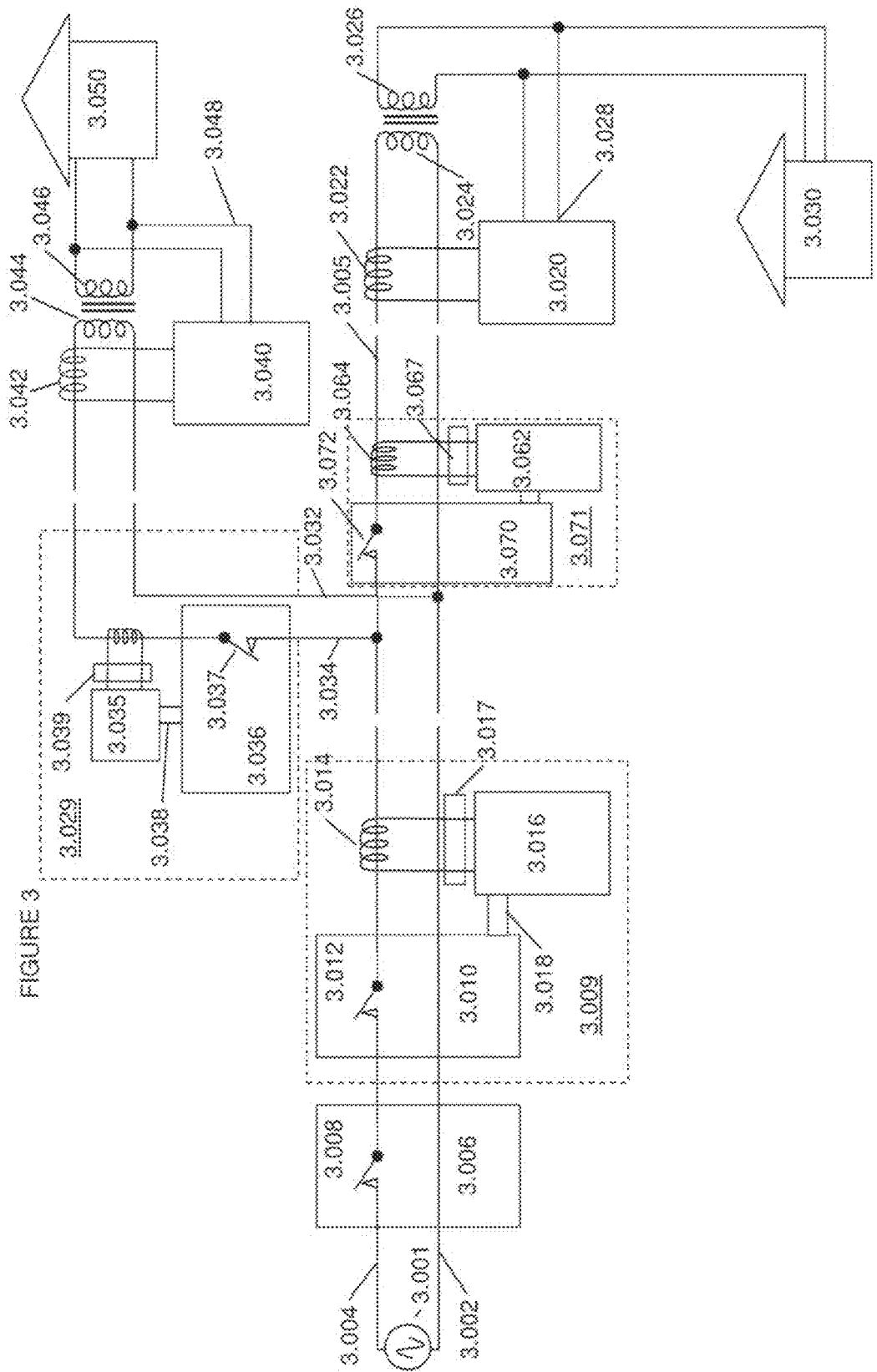
FIG. 3 illustrates a modification of the arrangement of FIG. 3 according to an embodiment of the invention.

FIG. 3 illustrates an embodiment in which it is possible to maintain power to each unbroken branch line while isolating any broken branch line. The arrangement of FIG. 3 is similar to that of FIG. 2 with the addition of detector circuit 3.071 on branch line 3.005, and the adaptation of filter 3.017 and detector 3.016 to receive return signals from the return signal generator of each branch.

In the arrangement of FIG. 3, each branch includes a detector such as 3.035, 3.062 proximate its junction with the power supply line. Each branch detector includes a filter 3.039, 3.067 adapted to select the specific return signal frequency generated by the return signal generator 3.040, 3.020 of the corresponding branch. Thus, when a branch line is broken, that branch will be isolated, while power is maintained to the remainder of the system.

The detector 3.016 upstream of the branch line junctions is adapted to receive the return signal frequencies of all branch line return signals. As long as at least one return signal is received, the detector 3.016 will maintain the relay contact 3.012 closed. Thus, power can be maintained to all unbroken branch lines, while detector 3.016 will cause relay 3.010 to open breaker switch 3.012 if the main line is broken upstream of the first branch line junction.

While the embodiment shown in FIG. 3 can protect each of N branch lines, in practice, the isolation breaker switches could be located to isolate groups of consumers to keep costs down.

Figure 4:
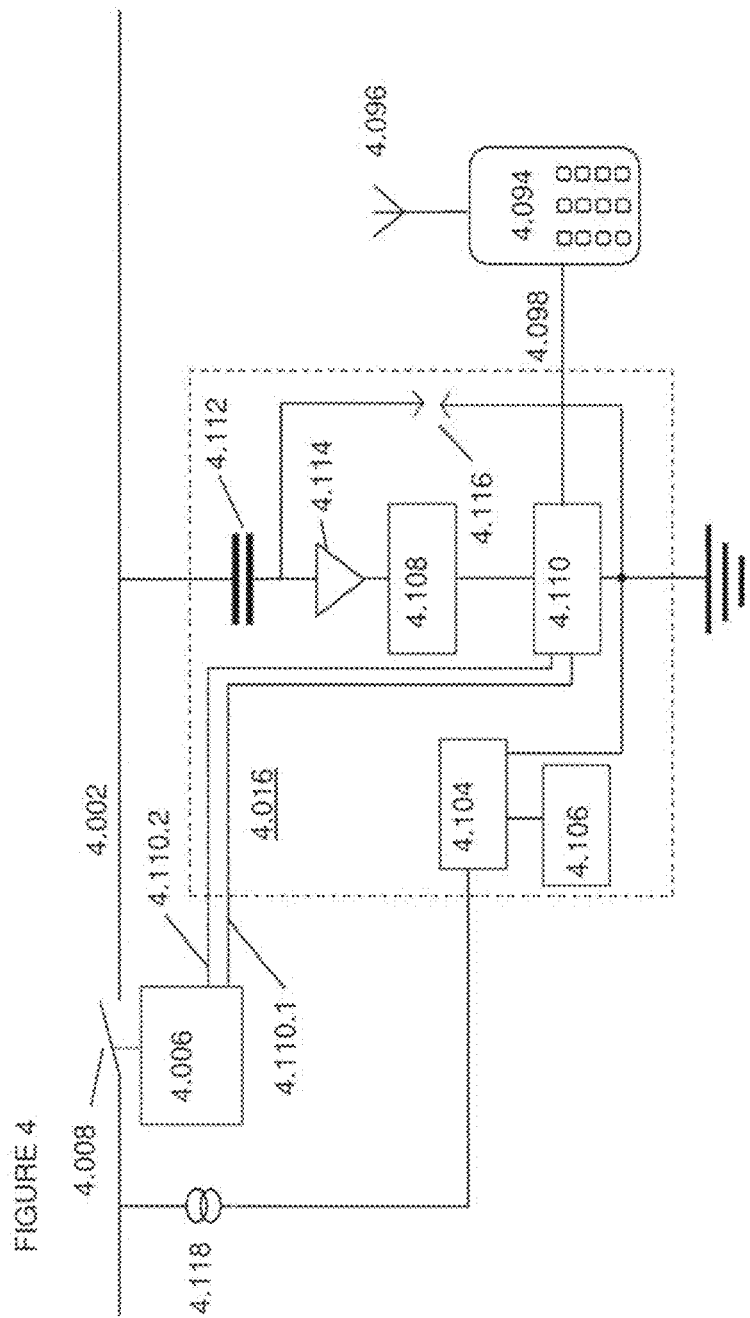
FIG. 4 illustrates schematically a detector according to an embodiment of the invention.

FIG. 4 illustrates the functional elements of a signal detector 4.016 according to an embodiment of the invention using characteristic bitstreams to distinguish the return signals from different RSGs.

The detector includes a transformer 4.118 supplying a power supply 4.104 to power the detector circuits and the relay 4.006. The detector uses capacitor 4.112 to capture the return signal on line 4.002. Amplifier 4.114 amplifies the return signal and delivers the amplified return signal to a demodulator 4.108 which in turn delivers the demodulated return signal to signal processing means 4.110.

The RSD controller 4.110 can comprise signal processing means, and can be adapted to receive and distinguish more than one return signal. Each return signal can have an individual signal characteristic. The RSD controller 4.110 analyses the bitstream and applies the appropriate algorithm or logic to control the breaker switch controller 4.006. The RSD controller 4.110 can be adapted to instruct the relay 4.006 to open the relay breaker switch 4.008 in the event that one of the return signals is absent.

The signal processing means can deliver a first control signal on line 4.110.1 to trigger relay 4.006 to open breaker switch 4.008 when a return signal is determined to be absent. The signal processor can be adapted to distinguish between two or more return signals from different branches.

The RSD controller 4.110 can provide an indication of which return signal is absent, and thus identify the faulty branch.

The signal processing means can also deliver a reclosure signal to the relay 4.006 on line 4.110.2 to reclose the breaker switch 4.008. Reclosure can be instigated when the line fault has been cleared. In addition, reclosure can be attempted after a specified time period to determine if the line fault was transitory.

The transformer 4.118, the power supply 4.104 for the RSD and the breaker switch control 4.006 are connected upstream of the protection breaker switch 4.008, while the signal detection capacitor 4.112 is connected downstream of the breaker switch 4.008. This arrangement ensures that the RSD remains powered when the breaker switch 4.008 is open, and that the detection capacitor 4.112 can receive bitstream signals from the downstream RSGs when the breaker switch 4.008 is open.

A control signal on line 4.110.1 can cause the breaker switch 4.008 to open, and a control signal on line 4.110.2 can cause the breaker switch 4.008 to close.

A second control signal can be generated by the RSD controller 4.110 to re-close the breaker switch 4.008 after a fault has been cleared or after a chosen time period in the case where a reclosure is used to ensure that the fault was not a transitory fault.

A transformer 4.118 derives power from the upstream side of the breaker switch 4.008.

A standby power supply 4.106 can also be provided.

A surge arrestor 4.116 can be included in the normal manner.

When the broken line has been repaired power can be applied to the line, for example, via a normally open manually operated breaker switch bridging the relay contacts of the protection circuit. The manually operated bridging switch may include a short hold time delay to permit the RSGs to power up and the RSD to receive the return signal. Alternatively, the breaker switch can be closed remotely, for example by the use of a wireless operated relay. As shown in FIG. 4, a wireless receiver or transceiver 4.094 can be incorporated on location with the detector 4.016. The receiver can include an antenna 4.096 and a control signal output 4.098.

The control signal output 4.098 can be used to produce a control signal to close the line break protection breaker switch remotely.

Power can be provided to the receiver 4.094 from the detector back-up power supply 4.106.

The receiver can be incorporated in a wireless transceiver to enable communication between the RSD station and a control centre or a field technician or linesman. For example, the signal processor can be adapted to send a message indicating which branch line is broken to a control centre or to a linesman. The transceiver can be, for example a cellular phone, such as a GSM phone, but other packet radio systems can be used.

Figure 5:
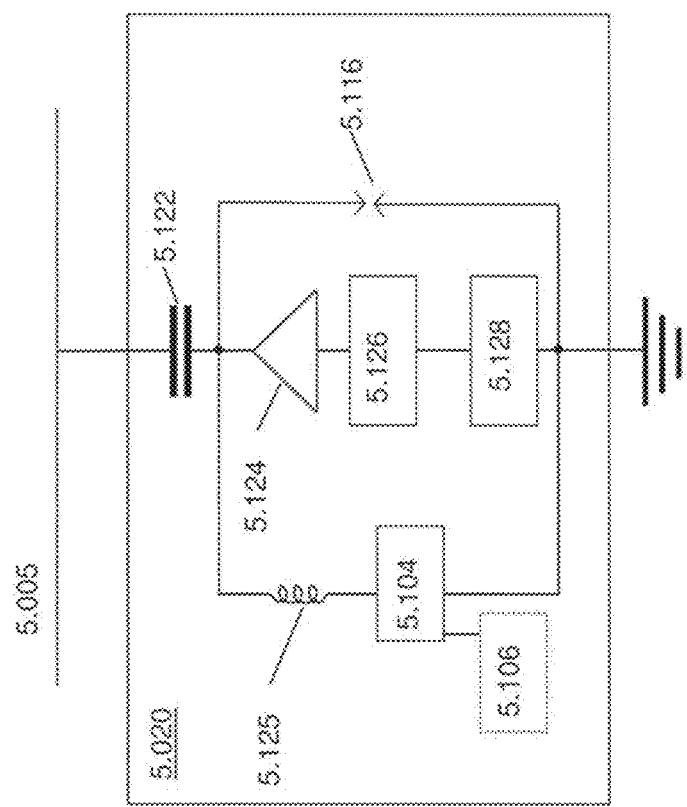
FIG. 5 illustrates a return signal generator according to an embodiment of the invention.

FIG. 5 illustrates a RSG 5.020 according to an embodiment of the invention. The RSG includes a power supply 5.104 and, optionally a back-up power supply 5.106. Power for the RSG is derived from the MV line 5.005 via a coupling capacitor 5.122 and choke coil 5.125, through which mains frequency power is delivered to power supply 5.104. Bitstream generator 5.128 generates the RSG's characteristic bitstream and applies it to the modulator 5.126. The modulator can be a frequency modulator to reduce sensitivity to interference. A line driver 5.124 receives the modulated signal and applies it to coupling capacitor 5.122, which connects the output of a power line communication line driver 5.124 to the supply line 5.005.

A surge arrestor 5.116 can be included in the normal manner.

The modulator 5.126 can apply the characteristic bitstream to more than one carrier frequency to provide redundancy.

Figure 6:
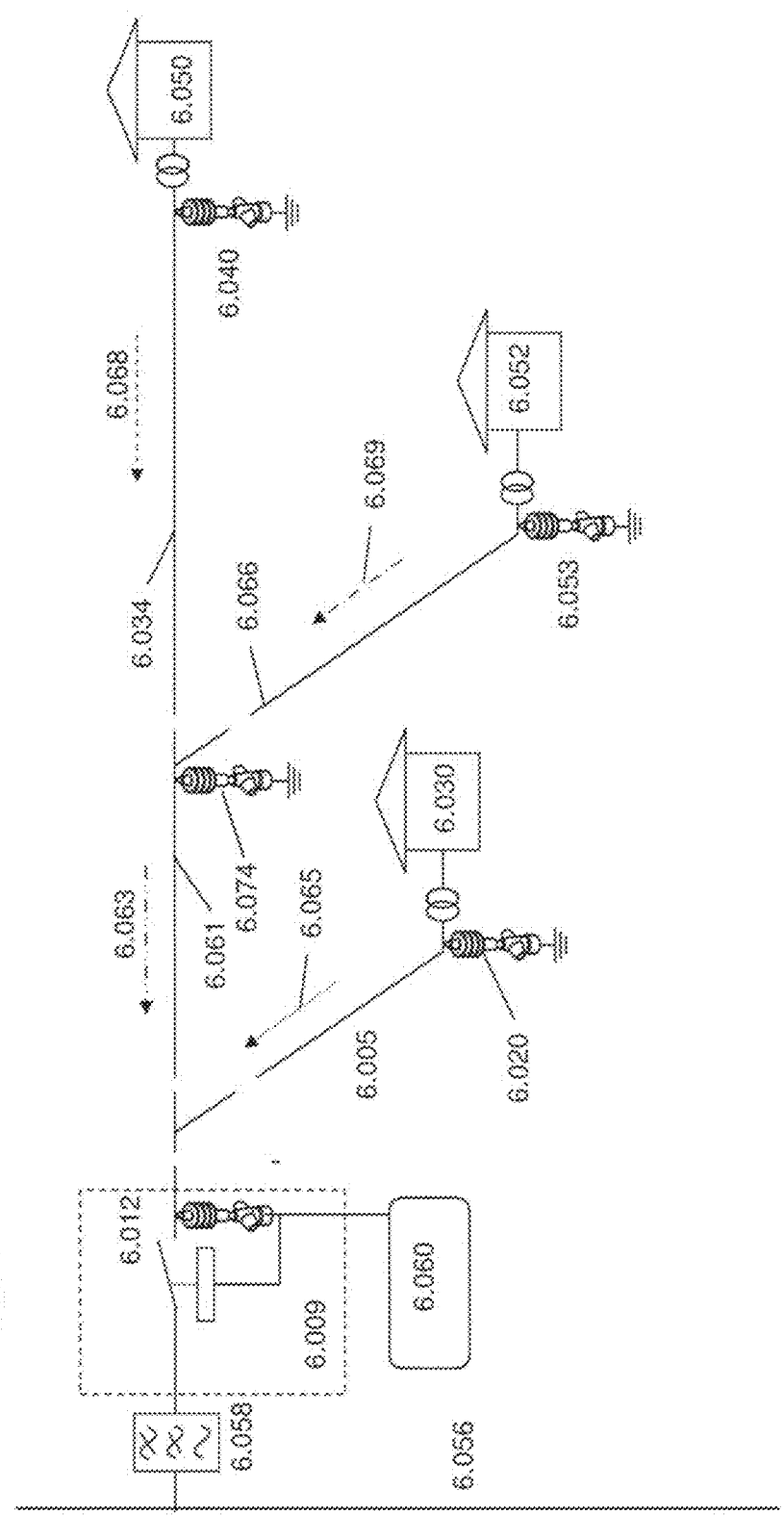
FIG. 6 illustrates a line break detection system in accordance with a further embodiment of the invention.

FIG. 6 illustrates a system according to a further embodiment of the invention. FIG. 6 shows a multiple-branch power supply protection arrangement which includes a single return signal detector 6.009 and breaker switch 6.012 controlling the power delivery to several branches, 6.005, 6.034, and 6.066. Branches 6.034 and 6.066 are each connected to a common section of power line 6.061.

In the arrangement of FIG. 6, the return signal generators are powered from the MV line, so there is no connection to the LV line. This arrangement is used as, in practice; safety regulations may restrict the connection of apparatus between the MV and LV lines such as shown in FIG. 1. Thus, power for the return signal generator is derived from the MV line.

As shown in FIG. 6, consumer 6.030 is connected to branch 6.005, consumer 6.050 is connected to branch 6.034, and consumer 6.052 is connected to branch 6.066.

A first return signal generator 6.020 is connected on the upstream side of the transformer supplying consumer 6.030. Similarly, a second return signal generator is connected on the upstream side of the transformer supplying consumer 6.050, and return signal generator 6.053 is connected on the upstream side of the transformed supplying consumer 6.052. The return signal generators can be capacitive coupled to the MV line, as discussed below with reference to FIG. 5. While power is delivered to RSG 6.020, it generates return signal 6.065. Similarly RSG 6.040 generates return signal 6.068, and RSG 6.053 generates return signal 6.069 as long as their respective branch lines are not broken.

In addition, a signal concentrator 6.074 is provided on the upstream side of the branch lines 6.034 and 6.066. Signal concentrator 6.074 is adapted to receive return signals from RSG 6.040 and RSG 6.053 and to regenerate a new return signal 6.063 so that only one return signal is then used to inform the return signal detector that both branches 6.034 and 6.066 are not broken, or that one of them has broken. The substituted return signal can be further modified to indicate in the event of a line break which of the branch lines 6.034 or 6.066 is broken.

The concentrator 6.074 can be adapted to ignore upstream return signals, e.g., from RSG 6.020.

Figure 9:
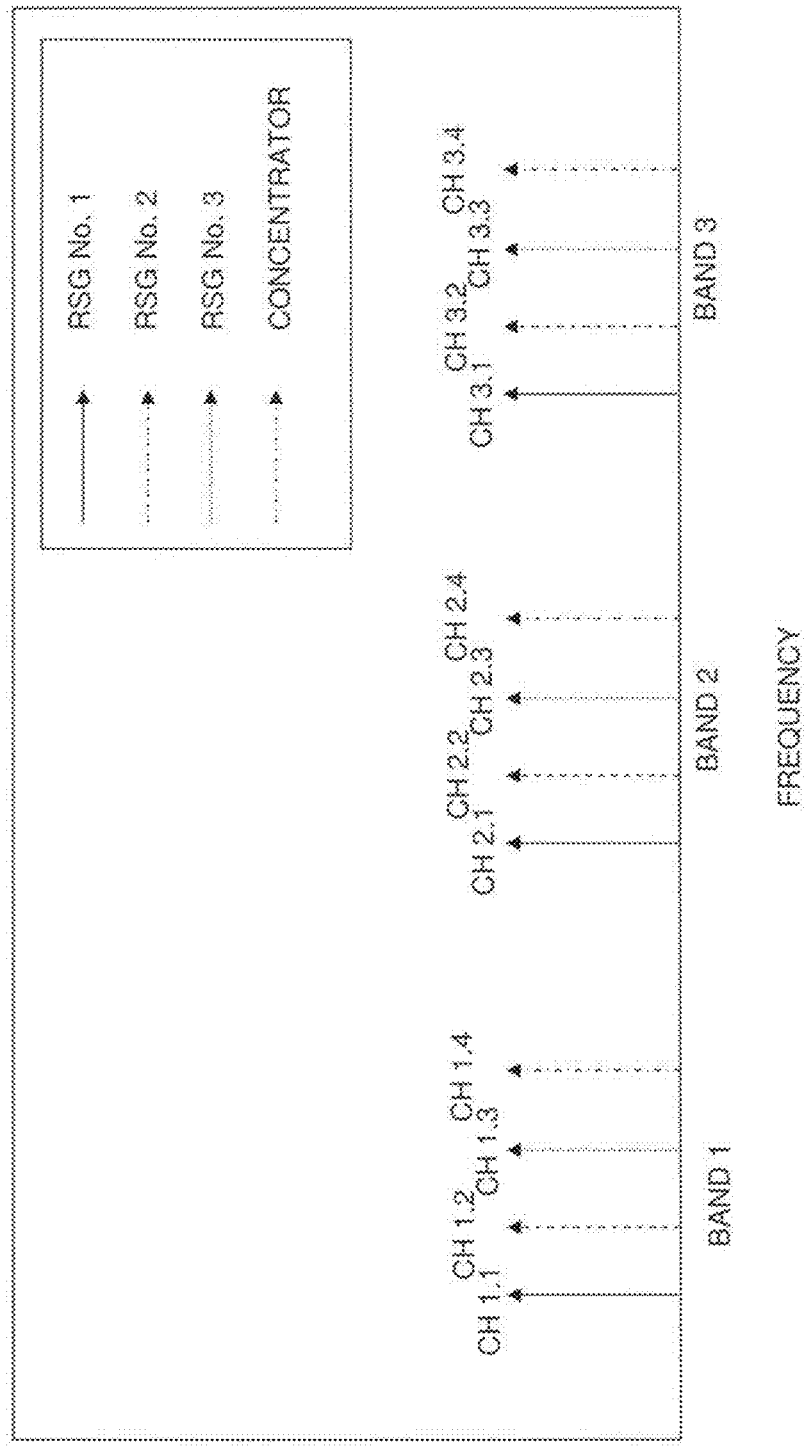
FIG. 9 illustrates redundant transmission of return signals in different frequency bands.

Rather than a simple frequency discrimination system, other signaling systems can be employed. For example, a bit pattern can be generated, each RSG generating a characteristic bit pattern which the RSD can detect and associate with the corresponding RSG. To provide a more robust signalling system, the bit pattern from each RSG can be transmitted over two or more carriers, e.g., two or more different frequencies as shown in FIG. 9. In FIG. 9, a first RSG (RSG 1) uses a carrier (CH 1.1, CH2.1, CH3.1) in each of three frequency bands (BAND 1, BAND 2, BAND 3). RSG 2 uses a different carrier (CH 1.2, CH2.2, and CH3.2) in each of the three frequency bands, and RSG 3 uses a different carrier (CH 1.3, CH2.3, CH3.3) in each of the three frequency bands. A concentrator uses a fourth carrier (CH 1.4, CH2.4, and CH3.4) in each frequency band which can be substituted for the signals from RSG 2 and RSG 3.

The concentrator can also function as a repeater where the distance from an RSG to the RSD results in attenuation of the RSG signal to the extent that it cannot be detected at the RSD.

Further robustness can be incorporated by using encoding in both time and frequency domains, making use of modulation systems such as ASK, FSK, PSK, and the like.

A blocking filter 6.058 can be added on the upstream side of the RSD so signal frequencies can be utilized in other branch lines connected to the main line 6.056.

A display 6.060 can be connected to the detector 6.009 to indicate which signal is missing, and thus identify the broken branch line.

Figure 7:
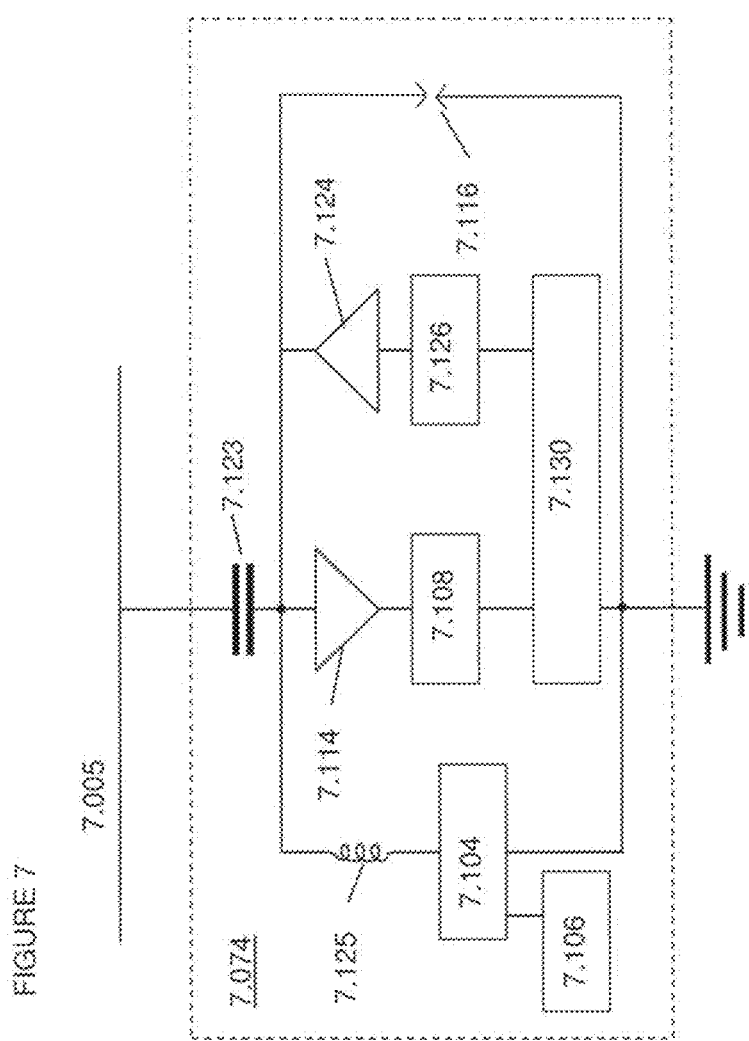
FIG. 7 illustrates return signal concentrator or repeater in accordance with an embodiment of the invention.

FIG. 7 illustrates a signal concentrator 7.074 in accordance with an embodiment of the invention. The signal concentrator serves the functions of receiving return signals from one or more RSGs, and generating a substitute signal indicating whether or not one of the lines to a RSG is broken. Accordingly, the concentrator is equipped with both signal detection and signal generation capabilities.

The signal detection function is provided by coupling capacitor 7.123, amplifier 7.114, demodulator 7.108, with digital signal analysis from controller 7.130 in a similar manner to that described with reference to the RSG of FIG. 5.

The concentrated return signal is provided by the controller 7.130, modulator 7.126, line driver 7.124, and coupling capacitor 7.123 in a similar manner to that described with reference to the RSD of FIG. 4.

The signal detection is carried out using the coupling capacitor 7.123, the amplifier 7.114, the demodulator 7.108, and the signal analysis capabilities of the concentrator controller 7.130. The controller 7.130 can be programmed to recognize the characteristic bitstream return signals from the two or more RSGs connected to the branches downstream of the concentrator.

When the received bitstreams from the two or more RSGs associated with the concentrator 7.074 indicate that all lines are unbroken, the controller 7.130 generates a new bitstream which indicates to the RSD, e.g., 6.009 in FIG. 6 that all lines are unbroken. Thus the breaker switch, e.g., 6.012 in FIG. 6 remains closed.

However, when one of the lines is broken, controller 7.130 detects the absence of one of the expected bitstreams, and thus sends a message to the upstream RSD (6.009). In its simplest form, the fault message could be merely the absence of the expected bitstream, so the RSD will detect the absence of the expected bitstream and open the breaker switch 6.012.

However, in this case, there is no indication of which branch line is broken.

In one embodiment adapted to provide information as to which branch is faulty, the concentrator can be programmed to generate a fault message bitstream indicating the branch from which the return signal is missing.

Where long lines are to be protected, a concentrator can be used as a repeater to regenerate a return signal from one or more downstream RSGs and transmit a regenerated signal upstream to the RSD. The repeater can have the same construction and functionality as the concentrator.

Figure 8:
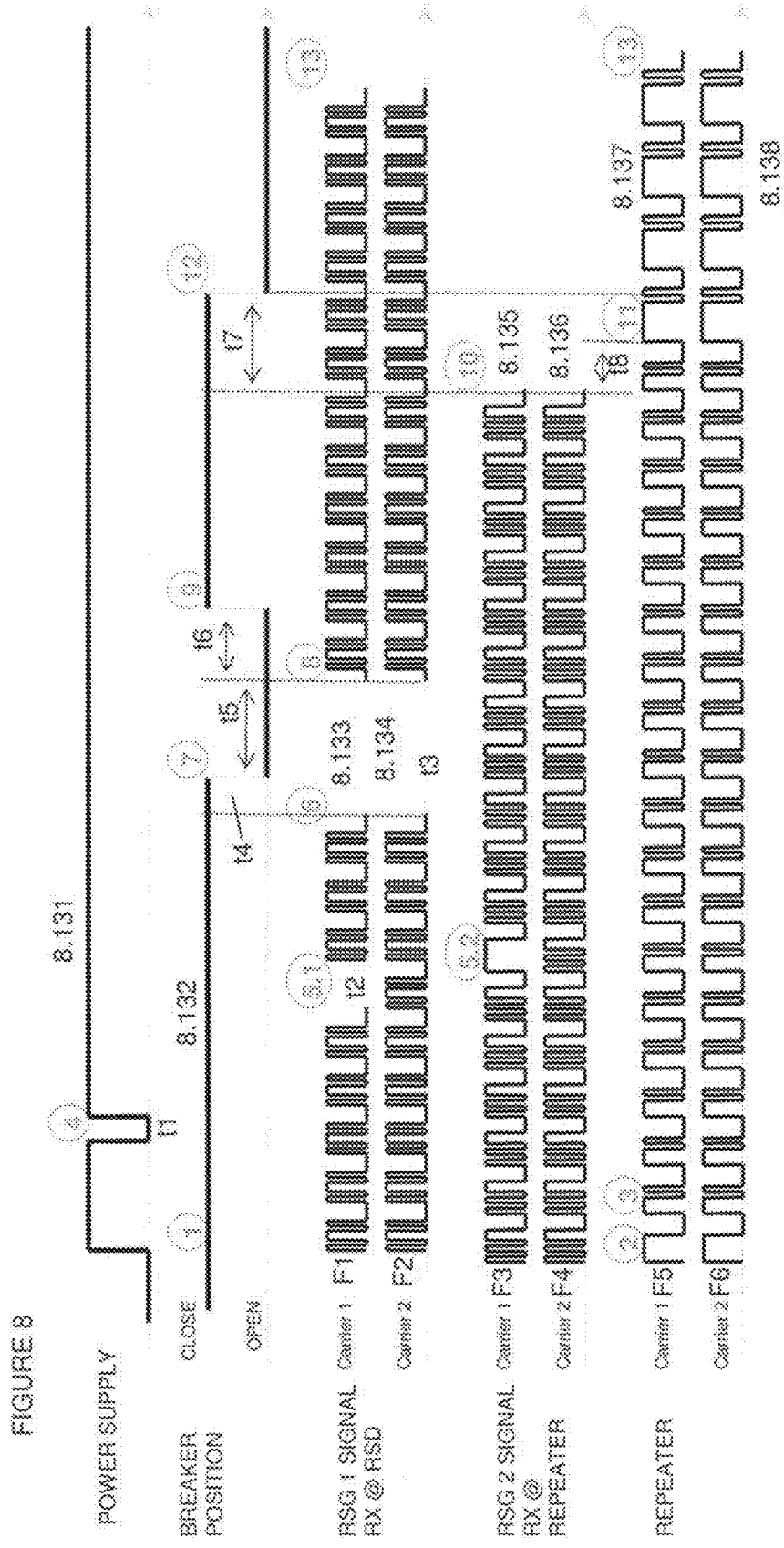
FIG. 8 illustrates hypothetical bitstreams illustrative of possible operating conditions in a system according to an embodiment of the invention.

FIG. 8 illustrates a number of possible bitstreams according to an embodiment of the invention including a first RSG (RSG 1) and utilizing a repeater for a second RSG (RSG 2), under various transmission and power supply conditions.

The topmost graph 8.131 illustrates the power supply voltage upstream of an RSD.

The second line 8.132 indicates the state of the RSD circuit breaker switch as CLOSED or OPEN.

The third and fourth lines 8.133 & 8.134 indicate return signals from a first RSG (RSG1) transmitted on two carriers F1 & F2 respectively, as received at the RSD.

The fourth and fifth lines 8.135 & 8.136 indicate return signals from the second RSG (RSG2) transmitted on two carriers F3 & F4 respectively, as received at a repeater.

The sixth and seventh lines 8.137 & 8.138 at frequencies F5 & F6 represent the regenerated signal from the repeater as received at the RSD.

Turning to the various circumstances illustrated, the breaker switch 8.132 of the RSD is initially closed at 1, and the power supply is applied to the line (first step in 8.131).

On initial power-up, the RSD breaker 8.132 is already closed as shown at point 1.

The return signals on F1 & F2 (8.133 & 8.134) are received by the RSD. The RSD will take a short period to verify the correct reception of the return signals on F1 & F2.

Return signals on F3 & F4 (8.135 & 8.136) are received at the repeater. As shown at point 2, during an initial signal recognition period, the repeater initially sends a signal to the RSD indicating it has not yet recognized the return signals on F3 & F4. At point 3, the repeater has recognized the return signal on F3 & F4 and sends to the RSD its characteristic concentrated return signal, one medium pulse and one short pulse in this example. Thus the RSD has a delay sufficient to allow the proper reception of the return signals from the directly connected RSGs and those connected via a concentrator to prevent incorrect opening of the breaker switch.

As the breaker switch is closed, the power supply is delivered to the two RSGs, RSG 1 & RSG 2. Thus RSG 1 generates its return signal in the form of a first characteristic bitstream 8.133. The characteristic bitstream of RSG 1 is a repeating pattern of one short pulse, a medium pulse, and a short pulse. This bitstream is applied to two carriers F1 & F2 by RSG 1.

Similarly, RSG 2 applies a second characteristic bitstream 8.134 to carriers F3 & F4. The second characteristic bitstream 8.134 is a repeated pattern of two short pulses and one medium length pulse.

When the bitstream from RSG 2 reaches the repeater, the repeater generates a third characteristic bitstream 8.137 and applies this to carriers F5 & F6.

Thus the RSD receives all the expected characteristic bitstreams, and maintains the breaker switch closed.

After a period of time, the power supply suffers a brief interruption at 4, and the breaker switch of the RSD remains closed. The interruption lasts for a period t1. The RSGs and the repeater can be designed to continue transmitting their characteristic bit patterns unless the power supply is interrupted for a time period td. Thus, if the power interruption is less than time period td, the RSGs and the repeater will continue to transmit their characteristic bitstreams. Furthermore, if the RSGs and repeater are provided with a backup power supply, they can continue to transmit their characteristic bitstreams independently of the presence or absence of the power from the power supply line.

The next event illustrated is the loss of the carrier F1 at point 5.1 for a period of t2. However, the bitstream on carrier F2 is still received by the RSD. Thus the RSD interprets the reception of the bitstream on F1 as merely a temporary loss of signal on one channel, rather than as a loss of power supply line continuity, so the RSD does not open the breaker switch 8.132.

Similarly, at point 5.2, the return signal bitstream from RSG 2 on F3 is corrupted for a short period, but, because the bitstream is also received on F4, the RSD ignores the corruption of the signal on F1.

The next event illustrates the performance of the system in the event of a temporary line fault in which the bitstreams on both F1 & F2 are lost for a time period t3 at point 6. After a delay t4, while the RSD verifies the loss of signal on both carriers F1 & F2, the RSD opens the breaker switch at point 7. However, in this example, the interruption to the return signal is only temporary, and the RSD again receives the return signals on both F1 & F2 after a time period t5 at point 8. After a further delay t6, during which the RSD confirms the reestablishment of the bitstreams on F1 & F2, the RSD closes the breaker switch 8.132 at point 9 and power is restored to the branch lines downstream of the RSD. In this way, reclosure can be achieved automatically when the temporary line fault has cleared.

To enable the return signal to be provided when the breaker switch is open, the RSG or the repeater or concentrator needs to have a power supply which does not require line power. Thus, RSGs, repeaters and concentrators can be equipped with a backup power supply as shown for example at 5.106 in FIG. 5, and at 7.106 in FIG. 7. The back-up power supply only needs to maintain operation of the RSG, repeater or concentrator for a short time, e.g., a few seconds to allow system power-up and system recovery from brief temporary line faults. This may be provided, for example, by a capacitor.

The delay in opening the breaker switch should be minimized so the breaker switch opens quickly after the loss of a return signal to reduce the time during which power is delivered to the broken line. During power-up, the RSD breaker switch can be disabled to allow the system to settle.

Figure 10:
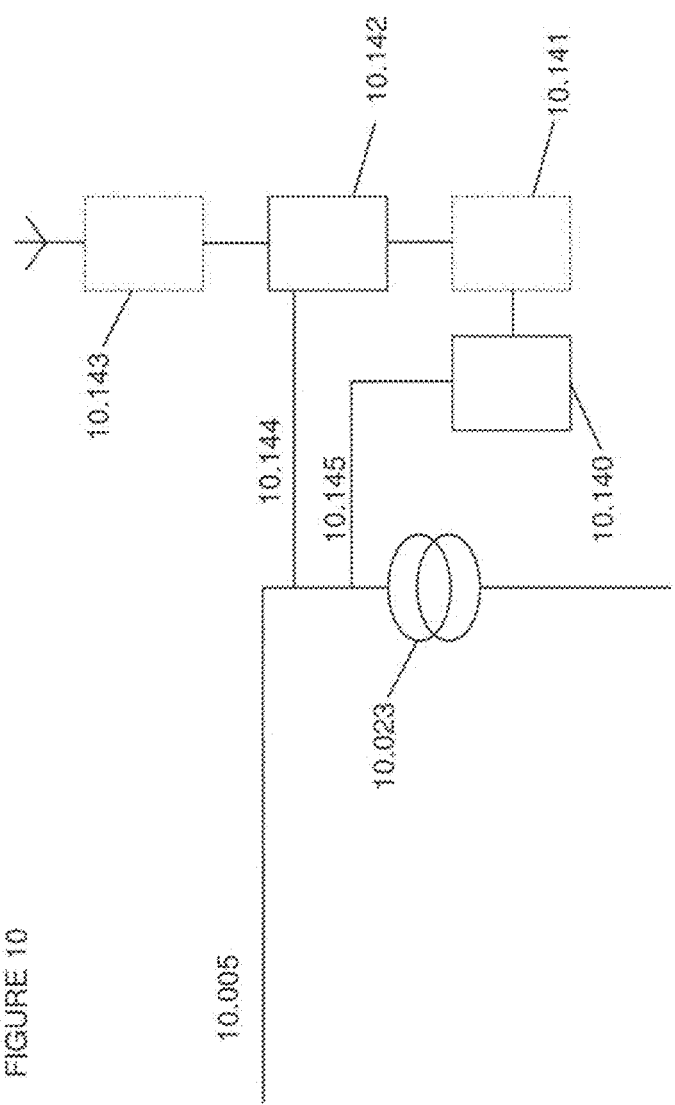
FIG. 10 schematically illustrates an RSG equipped with a wireless communicator according to an embodiment of the invention.

In some cases, it may be desirable to delay the operation of the RSG. FIG. 10 illustrates an RSG equipped with a voltage detector 10.140 connected to the supply line 10.005 on the upstream side of transformer 10.023 by line 10.145. An optional time delay 10.141 can be provided between the voltage detector 10.140 and the RSG 10.142. The RSG 10.142 can be equipped with an auxiliary power supply, or back-up battery. When the optional delay 10.141 is installed, the RSG can continue to send its return signal to the power supply line 10.005 via line 10.144 for a period determined by the delay 10.141.

Where there is a separate ACR circuit breaker, as at 1.008 in FIG. 1, the return signal detector may also be used to close the ACR switch when the return signal is detected after a transient fault if the ACR is equipped for such remote redosure.

In this embodiment, the RSG can include a current limiter to guard against overload caused by a grounded broken wire on the RSG side of the broken wire.

An optional wireless transmitter 10.143 may be used to send the return signal as an alternative to a repeater on long lines. The RSD can be equipped with a compatible wireless receiver, in a similar manner to wireless receiver 4.094 shown in FIG. 4.

Figure 11:
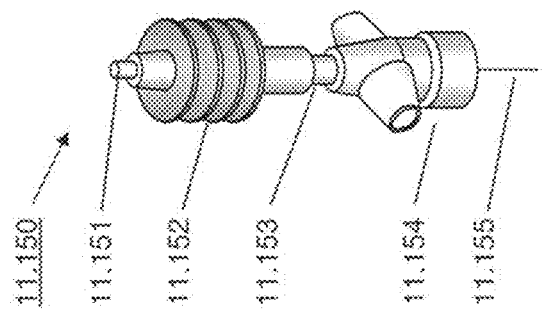
FIG. 11 illustrates a housing for an RSG according to an embodiment of the invention.

FIG. 11 illustrates physical aspects of a housing 11.150 for a RSG. The RSG housing includes a power supply line connection point 11.151, an insulator 11.152, a post attachment connection point 11.153, the housing 11.154 for the electronics of the RSG, and a return signal outlet 11.155. Additional ports can be provided in the housing 11.154, e.g., to connect an auxiliary power supply for the RSG. The auxiliary power supply can be, for example, a solar photo-voltaic power supply with power storage. Where such a wireless link is used, the wireless return signal can be sent in a "reverse" mode, such that the return signal is sent only in the case where the RSG detects that there is no voltage on the power supply line ion order to avoid the necessity of continuously transmitting a wireless return signal. This is possible where the RSG has an auxiliary power supply.

The following discussion considers some cases in which a fault is sufficient to trigger the ACR as well as one of the RSD breaker switches.

FIG. 12 and Tables 1 to 4 illustrate possible switch operating conditions for various fault conditions assuming a series connection of an ACR, a first RSD-RSG combination (RSD1-RSG1) and a second RSD-RSG combination (RSD2-RSG2) where the fault is sufficient to trip the ACR. Such an arrangement may be of advantage, for example, in a case where a long rural line is particularly susceptible to line faults in an end section of the line, protected by the second return signal detector-generator pair RGD2-RSG2.

The ACR breaker switch 12.008 is at the upstream end of the line section under consideration, RSD1-RSG1 are located between the ACR and RSG2-RSG2. The RSGs are assumed to have a back-up power source so they continue to generate their respective return signals when line power is lost, and their respective return signals are distinguishable. Note that the detector connection to the power line for the RSD is located downstream of the RSD's breaker switch, as shown in FIG. 4, so the return signal can be detected when the RSD's breaker switch is open. The power supply for the RSDs can be located upstream of the corresponding RSD breaker switch. The RSD can also be equipped with a back-up power supply.

FIG. 12 shows an ACR breaker switch 12.008, first RSD1(12.161) and associated switch SW1 (12.012).

TABLE 1

CASE A—Temp Fault between RSD2 & RSG2—ACR & SW2 open; SW1 closed

| LINE Fault beyond RSD2 | RSD1 receives RSG1 return signal | SW1 | RSD2 receives RSD2 return signal | SW2 | ACR tripped? | ACR | Power to fault site |
|---|---|---|---|---|---|---|---|
| Temp fault | YES | Closed | NO | Open | YES | Open | Fault isolated by RSD2 & ACR |
| Temp fault cleared | YES | Closed | YES | Closed | YES | Open | ACR breaker switch open |
| ACR recloses | YES | Closed | YES | Closed | NO | Closed | Power restored to RSG2 after temporary fault |

Each row of the Table represents a sequential operation following a fault

Case A in Table 1, shows the operation of the switches for a temporary fault in the RSD2-RSG2 section which is sufficient to trigger the ACR breaker switch 12.008 to open. RSD2 breaker switchSW2 (12.165) opens as the fault interrupts the return signal from RSG2. RSD1 breaker switch SW1 does not open because it continues to receive its corresponding return signal from RSG1. In this case, when the fault clears in a time less than the ACR reclosure period, RSD2 breaker switch SW2 closes because RSD2 again receives the return signal from RSG2, but the ACR breaker switch remains open. When the ACR reclosure time expires, the ACR recloses, and, as the fault has cleared, power is restored to RSG2.

TABLE 2

| CASE B—Temp Fault between RSD1 & RSG1—SW1 & ACR open; SW2 closed | | | | | | | |
|---|---|---|---|---|---|---|---|
| LINE Fault between RSD1 & RSG1 | RSD1 receives RSG1 return signal | SW1 | RSD2 receives RSD2 return signal | SW2 | ACR tripped? | ACR | Power to fault site |
| Temp fault | NO | Open | YES | Closed | YES | Open | Fault isolated by RSD1 & ACR |
| Temp fault cleared | YES | Closed | YES | Closed | YES | Open | ACR breaker switch open |
| ACR recloses | YES | Closed | YES | Closed | NO | Closed | Power restored to RSG2 after temporary fault |

Each row of the Table represents a sequential operation following a fault

Case B in Table 2 shows the switch operation for a temporary fault between RSD1 and RSG1, which is sufficient to trip the ACR breaker switch. Again RSD1 opens its breaker switch, while RSD2 maintains its breaker switch open because it continues to receive the return signal from RSG2. When the fault clears, RSD1 receives the return signal from RSG1 and closes its breaker switch. At this point, the ACR breaker switch is still open. When the ACR reclosure time expires, the ACR closes and restores power to the line.

from RSG2 and its breaker switch remains closed. However, no power is received beyond the ACR breaker switch because the ACR breaker switch is open. The fault is initially isolated by both the ACR breaker switch and RSD1 breaker switch SW1. After the reclosure time of the ACR expires, the ACR breaker switch closes. Because RSD1 breaker switch is open, the ACR no longer sees the fault, and the ACR breaker switch remains closed, so the fault is isolated by the breaker switch of RSD1.

TABLE 3

| CASE C—Broken line between RSD2 & RSG2—ACR & SW2 open; SW1 closed | | | | | | | |
|---|---|---|---|---|---|---|---|
| LINE Fault beyond RSD2 | RSD1 receives RSG1 return signal | SW1 | RSD2 receives RSD2 return signal | SW2 | ACR tripped? | ACR | Power to fault site |
| Broken line | YES | Closed | NO | Open | YES | Open | Fault isolated by RSD2 & ACR |
| ACR recloses | YES | Closed | NO | Open | NO | Closed | Fault isolated by RSD2. Power to RSG1 |

Each row of the Table represents a sequential operation following a fault

Case C in Table 3 shows the case where a broken line (permanent fault) between RSD2 and RSG2 also triggers the ACR breaker switch. Again RSD1 receives the return signal from RSG1. RSD2 does not receive the return signal from RSG2 because of the line break, so the RSD2 breaker switch SW2 is opened. When the ACR reclosure time expires, the fault is isolated by RSD1 breaker switch, so ACR no longer sees the fault, and remains closed. RSD2 isolates the fault. Power is restored to RSG1

While frequency selective filters have been described as a means of differentiating between different return signals, a person skilled in the art will understand that other means may be used to enable differentiation between return signals. For example the return signals can be encoded, and the detectors can be enabled to decode the return signals to differentiate between the different return signals.

While the terms "upstream" and "downstream" have been defined by reference to the power supply source to simplify

TABLE 4

| CASE D—Broken line between RSD1 & RSG1—ACR & SW1 open; SW2 closed | | | | | | | |
|---|---|---|---|---|---|---|---|
| LINE Fault between RSD1 & RSG1 | RSD1 receives RSG1 return signal | SW1 | RSD2 receives RSD2 return signal | SW2 | ACR tripped? | ACR | Power to fault site |
| Broken line | NO | Open | YES | Closed | YES | Open | Fault isolated by RSD1 & ACR |
| ACR recloses | NO | Open | YES | Closed | NO | Closed | Fault isolated by RSD1 |

Each row of the Table represents a sequential operation following a fault

Case D in Table 4 shows the switch operation for a broken line between RSD1 and RSG1 which also trips the ACR breaker switch. The broken line prevents RSD1 from receiving the return signal from RSG1, so the breaker switch SW1 of RSD1 opens. RSD2 continues to receive the return signal the explanation of the invention, in the case where a segment of line is powered from each end of the segment, RSDs can be placed between an RSG and each power supply source.

In this specification, reference to a document, disclosure, or other publication or use is not an admission that the document, disclosure, publication or use forms part of the common general knowledge of the skilled worker in the field of this invention at the priority date of this specification, unless otherwise stated.

In this specification, terms indicating orientation or direction, such as "up", "down", "vertical", "horizontal", "left", "right" "upright", "transverse" etc. are not intended to be absolute terms unless the context requires or indicates otherwise. These terms will normally refer to orientations shown in the drawings.

In this specification, "device" can include one or more separate physical components.

Where ever it is used, the word "comprising" is to be understood in its "open" sense, that is, in the sense of "including", and thus not limited to its "closed" sense, that is the sense of "consisting only of". A corresponding meaning is to be attributed to the corresponding words "comprise", "comprised" and "comprises" where they appear.

It will be understood that the invention disclosed and defined herein extends to all alternative combinations of two or more of the individual features mentioned or evident from the text. All of these different combinations constitute various alternative aspects of the invention.

While particular embodiments of this invention have been described, it will be evident to those skilled in the art that the present invention may be embodied in other specific forms without departing from the essential characteristics thereof. The present embodiments and examples are therefore to be considered in all respects as illustrative and not restrictive, and all modifications which would be obvious to those skilled in the art are therefore intended to be embraced therein.

The invention claimed is:

1. A method of detecting a break or short circuit on a section of a power supply line, said method comprising steps of:
   injecting a return signal at a downstream end of the section of the power supply line with a power supply line fault detection return signal generator (return signal generator) including a power supply, power for the return signal generator being derived from a medium voltage line via a coupling capacitor and a choke coil through which a main frequency power is delivered to the power supply, a bitstream generator generates the return signal generator's characteristic bitstream and applies it to a modulator,
   a line driver receiving a modulated signal and applies it to the coupling capacitor, said coupling capacitor connects an output of the line driver to the medium voltage line; and
   detecting the return signal at an upstream end of the section of the power supply line with a power supply line fault detection return signal detector (return signal detector), said return signal detector including a transformer supplying power to the return signal detector and a relay that is coupled to a return signal detector controller, the return signal detector using a capacitor to capture the return signal on the power supply line and an amplifier to provide an amplified return signal to a demodulator which in turn delivers a demodulated return signal to signal processing means.

2. The method of detecting the break or short circuit as claimed in claim 1, including a step of removing power from the section of the power supply line in an event of failure to detect the return signal at the upstream end of the section.

3. The method of detecting the break or short circuit as claimed in claim 1, wherein said return signal generator:
   generates the return signal; and
   applies the return signal to the power supply line.

4. The method of detecting the break or short circuit as claimed in claim 1, wherein said return signal detector:
   receives the return signal from the power supply line;
   analyses the return signal; and
   produces a power line control signal in response to a presence or an absence of the return signal.

5. The method of detecting the break or short circuit as claimed in claim 4, wherein said return signal detector further includes a power interruption breaker switch to remove power from the power supply line in response to the detection of an absence of a return signal.

6. The method of detecting the break or short circuit as claimed in claim 3, further implements a return signal repeater including a return signal detection means that has
   a return signal detection coupling capacitor,
   an amplifier,
   a demodulator, and a controller,
   adapted to detect return signals from the return signal generator, and
   a return signal regeneration means that has
   a modulator,
   a line driver and a return signal regeneration coupling capacitor.

7. The method of detecting the break or short circuit as claimed in claim 3, further comprising a return signal concentrator comprising:
   return signal detection means adapted to detect and distinguish two or more return signals from two or more return signal generators; and
   a return signal regeneration means adapted to produce a concentrated return signal.

8. The method of detecting the break or short circuit as claimed in claim 7, wherein
   the concentrated return signal is adapted to indicate a presence or an absence of each of the two or more return signals from the two or more return signal generators.

9. The method of detecting the break or short circuit as claimed in claim 4, said method employing either at least one return signal generator or a plurality of return signal generators wherein said at least one of the return signal generators;
   generates the return signal and applies the return signal to the power supply line, where each return signal generator is adapted to generate a characteristic return signal which is applied to the power supply line, and
   said method employing either at least one return signal detector or a plurality of return signal detectors, wherein the return signal detector connected to the power supply line upstream of the at least one or each return signal generator detects the return signal to confirm continuity of the power supply line, and, in the absence of the return signal, generates a fault signal.

10. The method of detecting the break or short circuit as claimed in claim 9, further comprising a first breaker switch, the return signal detector being adapted to operate the first breaker switch to isolate the power supply line from a source of electrical power when the return signal detector detects the absence of the return signal.

11. The method of detecting the break or short circuit as claimed in claim 9, wherein the return signal detector is adapted to associate each characteristic return signal with a corresponding one of said return signal generators.

12. The method of detecting the break or short circuit as claimed in claim 9, further comprising a return signal concentrator, adapted to receive return signals from two or more downstream return signal generators, and to generate a concentrated return signal for transmission to the return signal detector.

13. The method of detecting the break or short circuit as claimed in claim 9, further comprising a branch line including a branch line return signal generator located at a distance from a junction of a second branch line, the branch line return signal generator generating a characteristic return signal associated with the branch line return signal generator, the system including a branch line return signal detector located on the branch line near the junction of the second branch line, the branch line return signal detector being adapted to detect the characteristic return signal from the branch line return signal generator.

14. The method of detecting the break or short circuit as claimed in claim 13, further comprising a breaker switch adapted to disconnect the branch line from a source of electrical power in response to a control output from the branch line return signal detector.

15. The method of detecting the break or short circuit as claimed in claim 9, wherein the at least one of or each return signal generator or a signal concentrator includes a back-up power supply to enable the return signal generator to continue to transmit a characteristic return signal in an event of loss of power from the power supply line.

16. The method of detecting the break or short circuit as claimed in claim 14, wherein the return signal detector is adapted to receive return signals after the breaker switch has opened, and, in an event of reception of the return signal which had been temporarily interrupted, to close the breaker switch.

17. The method of detecting the break or short circuit as claimed in claim 4, wherein said method includes a monitoring system monitoring a segment of the power supply line,
   wherein the return signal generator generates the return signal and transmits the return signal to the return signal detector, to indicate a presence or an absence of a supply voltage at the downstream end of the section of the power supply line.

18. The method of detecting the break or short circuit as claimed in claim 17, wherein the return signal generator transmits the return signal wirelessly.

19. The method of detecting the break or short circuit as claimed in claim 18, wherein the return signal generator transmits the return signal to the return signal detector in the absence of the supply voltage at the downstream end of the segment of the power supply line.

20. The method of detecting the break or short circuit as claimed in claim 1, wherein the return signal generator has
   a line voltage detector;
   a signal generator controlled by the line voltage detector to generate the return signal; and
   a wireless transmitter connected to the signal generator to transmit the return signal.

* * * * *

UNITED STATES PATENT AND TRADEMARK OFFICE
CERTIFICATE OF CORRECTION

PATENT NO. : 9,983,250 B2  
APPLICATION NO. : 14/242271  
DATED : May 29, 2018  
INVENTOR(S) : Kenneth Willis Barber et al.

Page 1 of 1

It is certified that error appears in the above-identified patent and that said Letters Patent is hereby corrected as shown below:

On the Title Page

Item (30), should read:  
Foreign Application Priority Data  
February 25, 2014    AUSTRALIA    2014200964  
October 31, 2013    AUSTRALIA    2013904213

Signed and Sealed this  
Twenty-third Day of July, 2019

Andrei Iancu  
*Director of the United States Patent and Trademark Office*